United States Patent
Gay et al.

(10) Patent No.: US 7,859,299 B1
(45) Date of Patent: Dec. 28, 2010

(54) CIRCUIT FOR CONTROLLING DATA COMMUNICATION WITH SYNCHRONOUS STORAGE CIRCUITRY AND METHOD OF OPERATION

(75) Inventors: James G. Gay, Pflugerville, TX (US); Carlos A. Greaves, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/500,975

(22) Filed: Jul. 10, 2009

(51) Int. Cl.
*H03K 17/16* (2006.01)
*G11C 7/10* (2006.01)

(52) U.S. Cl. ............... 326/30; 326/62; 365/189.06
(58) Field of Classification Search ............ 326/30, 326/62, 86; 365/189.06, 207
See application file for complete search history.

(56) References Cited

U.S. PATENT DOCUMENTS

| | | | |
|---|---|---|---|
| 6,512,704 B1 * | 1/2003 | Wu et al. | ............... 365/189.07 |
| 6,615,345 B1 | 9/2003 | LaBerge | |
| 6,629,225 B2 | 9/2003 | Zumkehr | |
| 6,853,594 B1 | 2/2005 | Wu et al. | |
| 6,940,760 B2 | 9/2005 | Borkenhagen et al. | |
| 7,002,378 B2 | 2/2006 | Srikanth et al. | |
| 7,020,031 B2 | 3/2006 | Shin et al. | |
| 7,218,557 B1 | 5/2007 | Chlipala et al. | |
| 7,257,035 B2 | 8/2007 | Hsieh et al. | |
| 7,345,933 B1 | 3/2008 | Telem et al. | |
| 7,382,665 B2 | 6/2008 | Hsieh et al. | |
| 7,394,707 B2 | 7/2008 | Seto et al. | |

\* cited by examiner

*Primary Examiner*—Daniel D Chang
(74) *Attorney, Agent, or Firm*—Robert L. King; Susan C. Hill; Kim-Marie Vo

(57) ABSTRACT

A method and circuit includes providing at least one conductor for receiving an input signal. A termination circuit and a clamp circuit are coupled to the at least one conductor. The termination circuit is enabled while the clamp circuit remains enabled. The clamp circuit is disabled. After disabling the clamp circuit, while the termination circuit remains enabled, both a first differential comparator and a second differential comparator are enabled. The first differential comparator receives a first differential input signal at a first input and a second differential input signal at a second input. The second differential comparator detects when a difference between the first differential input signal and the second differential input signal is greater than a predetermined value and enables transfer of an output of the first differential comparator to a memory controller.

20 Claims, 5 Drawing Sheets

CIRCUIT FOR CONTROLLING DATA COMMUNICATION WITH SYNCHRONOUS STORAGE CIRCUITRY AND METHOD OF OPERATION

BACKGROUND

1. Field

This disclosure relates generally to semiconductors, and more specifically, to the control of a data strobe signal used by synchronous interface control and storage circuitry.

2. Related Art

Synchronous dynamic random access memory (SDRAM) utilize one or more reference clock signals provided by a memory controller to manage data transfers via one or more data strobe signals in a data processing system. The input and output data of the SDRAM are synchronized in a predetermined relationship to a data strobe signal. Double data rate (DDR) SDRAMs allow data transfers at twice the clock rate in relationship to both the rising and falling edges of the data strobe.

Conventional DDR SDRAMs use a bi-directional data strobe signal commonly referred to as a DQS signal. A data strobe receiver receives the DQS signal from either SDRAM or a memory controller and functions to provide a reference strobe signal to properly capture data. DQS and data generated by the memory controller to SDRAM (write transfer) are required to meet setup and hold time requirements centered about DQS transitions while DQS and data generated by the SDRAM to the memory controller (read transfer) are valid between DQS transitions.

For example, DDR SRAM memory controllers and SDRAM use the DQS strobe signals to send data to the SDRAM (write transfers) and receive data from the SDRAM (read transfers). The DQS data strobe signal functions as a reference timing signal to enable data capture. It is a requirement of industry standards that data be centered about DQS transitions meeting setup and hold time requirements of the SDRAM for write transfers performed by an SDRAM controller and valid between DQS transitions from the SDRAM for read transfers performed by an SDRAM controller. Industry standards define several states of DQS before, during and after a transfer of data. Before a transfer of data, DQS is in a high-impedance state that is known as Hi-Z. When DQS is in Hi-Z, DQS is at an undefined voltage level between logic high and logic low. In the clock cycle immediately before a data transfer, DQS transitions from the Hi-Z high-impedance state to a logic low. This logic low state is known as a data strobe preamble. After the data strobe preamble, DQS transitions are used to synchronize the data transaction. One half clock before the data transfer is complete, while DQS is in a logic low state, is known as the data strobe postamble. After completion of the postamble, the DQS data strobe signal again enters the Hi-Z high-impedance state provided another transfer does not immediately begin. Because the DQS strobe signal is not driven until the data strobe preamble starts and is again stopped from being driven at the end of a transaction in the postamble, it is important that a data strobe receiver be turned on and off at precisely the correct time in order to generate an internal digital DQS strobe signal with the correct timing. Otherwise indeterminate control signal values may be generated or the internal DQS strobe signal may oscillate and thereby result in erroneous latching of information.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
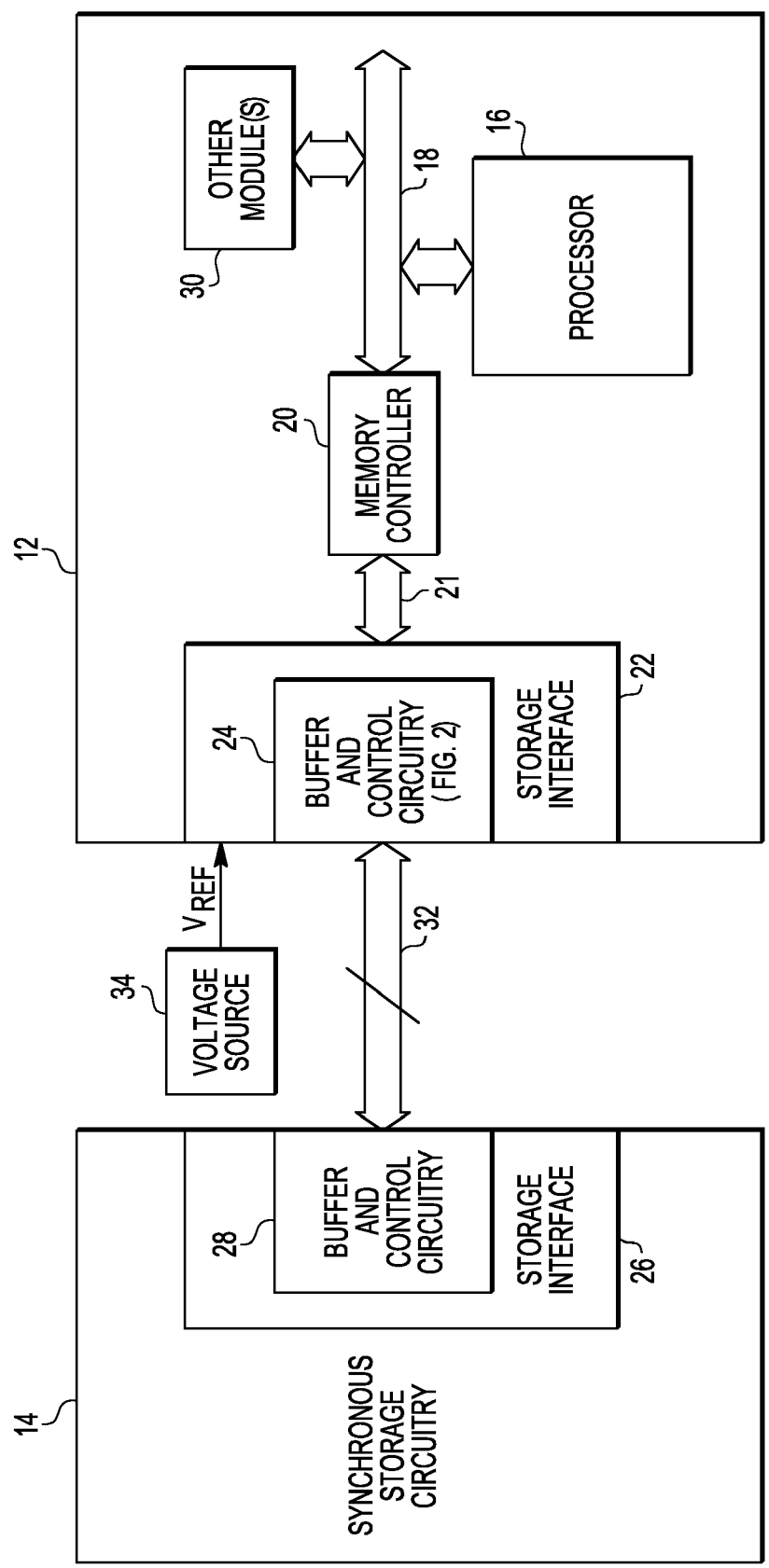
FIG. 1 illustrates in block diagram form an exemplary processing system in accordance with one form of the present invention.

Illustrated in FIG. 1 is an exemplary processing system 10 having a circuit for controlling data communication with synchronous storage circuitry in accordance with the present invention. A processing unit 12 is coupled to synchronous storage circuitry 14 via an interconnect 32. The processing unit 12 has a processor 16 that is bidirectionally coupled to an interconnect 18. A memory controller 20 has a first port of multiple signals that are bidirectionally coupled to the interconnect 18. The memory controller 20 has a second port of multiple signals that are bidirectionally coupled to a first multiple bit input/output of a storage interface 22 via an interconnect 21. The storage interface 22 includes a buffer and control circuitry 24 that will be further described in detail in FIG. 2. A voltage source 34 has an output connected to one or more input terminals of the storage interface for providing a reference voltage $V_{REF}$. A second multiple bit input/output of the storage interface 22 is connected to a multiple bit input/output of a buffer and control circuitry 28 that is contained within a storage interface 26 of the synchronous storage circuitry 14. In one form the buffer and control circuitry 28 has the same circuit configuration and function as the buffer and control circuitry 24. The synchronous storage circuitry 14 may be any of a variety of types of memory, including SDRAM, synchronous read only memory (ROM), synchronous FLASH and synchronous magnetoresistive RAM (MRAM). One or more other module(s) 30 are bidirectionally coupled to the interconnect 18 within the processing unit 12. Examples of the one or more other module(s) 30 including various peripherals and processing units, such as a graphics processor, a graphics unit interface, and a display device.

In operation, the processing system 10 uses processor 16 to execute predetermined data processing instructions. Processor 16 communicates with the synchronous storage circuitry 14 by reading information (i.e. instructions, addresses and/or data) from the synchronous storage circuitry 14 and writing similar information to the synchronous storage circuitry 14 via the interconnect 32. Because the synchronous storage circuitry 14 is a synchronous device, a DQS strobe signal is transferred between the memory controller 20 and synchronous storage circuitry 14 to time the capturing and sending of information. The storage interface 22 and storage interface 26 function as an interface between the memory controller 20 and synchronous storage circuitry 14. Within each storage interface circuit is buffer and control circuitry that functions to receive a DQS signal and buffer it to reliably provide at a correct logic value the DQS signal. The timing function provided by each of the buffer and control circuitry 24 and buffer and control circuitry 28 ensures that the DQS signal has a correct signal value during both the preamble and postamble phases of the DQS strobe signal and thereby avoid data corruption that is common with conventional DQS input/output circuitry.

Figure 2:
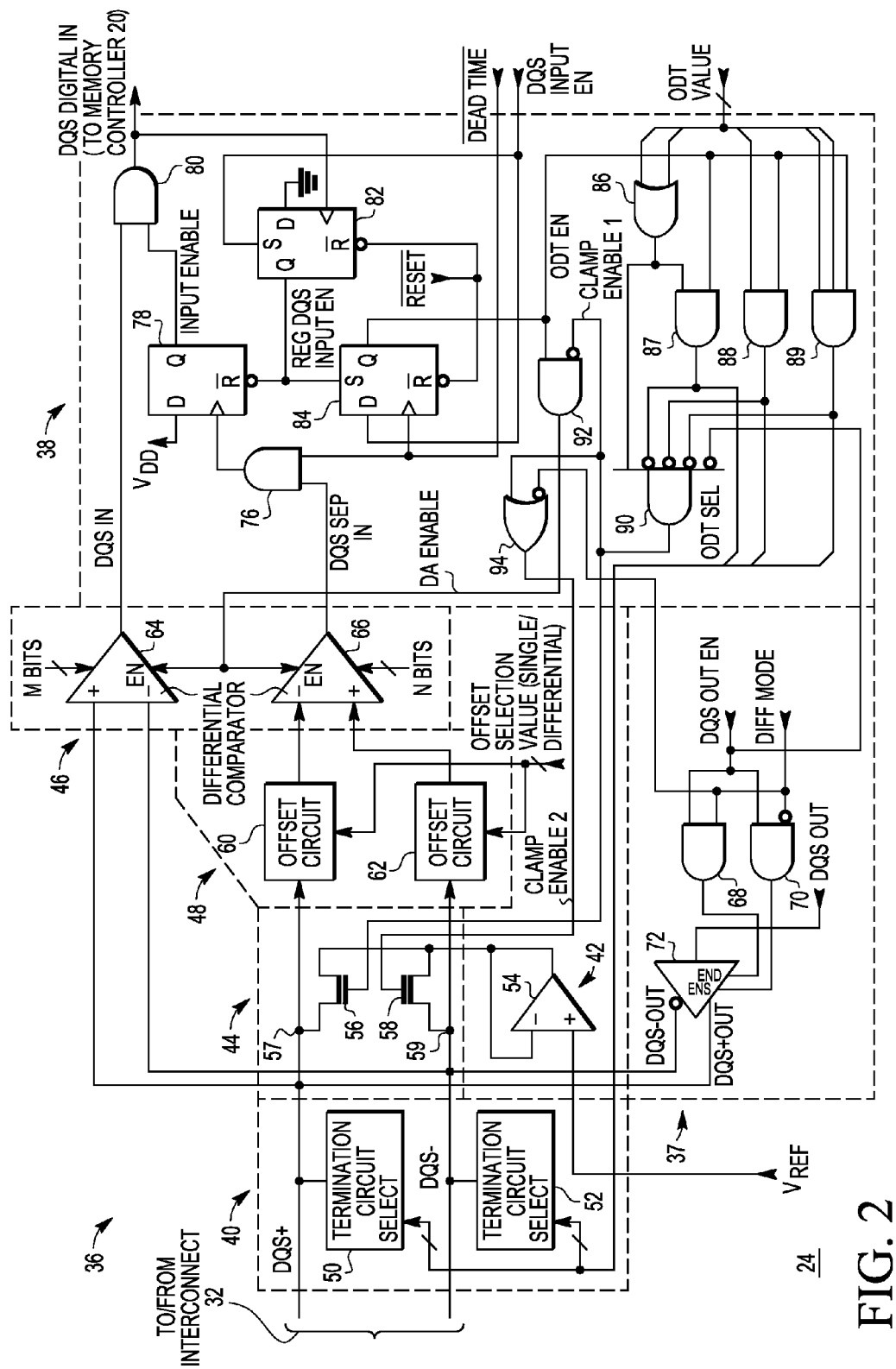
FIG. 2 illustrates in schematic form an I/O (input/output) buffer and control circuitry in accordance with one form of the present invention.

Illustrated in FIG. 2 is an exemplary form of the buffer and control circuitry 24 of FIG. 1. It should be understood that although not shown in detail, the buffer and control circuitry 28 is analogous to the buffer and control circuitry 24. Generally, the buffer and control circuitry 24 has an input buffer portion 36, an output buffer portion 37 and a control circuit portion 38. Within the input buffer portion 36 is a termination circuit portion 40, a voltage follower portion 42, a clamp circuit portion 44, a differential comparator portion 46 and a signal offset portion 48. A single ended DQS signal and $V_{REF}$ are coupled to inputs of Control Circuitry 24 which have two respective outputs for providing a differential DQS signal. The differential DQS signal has a positive DQS signal (DQS+) and a negative DQS signal (DQS−). For differential operation, the DQS+ and DQS− signals to/from interconnect 32 are connected to DQS+ and DQS− of Buffer and Control circuitry 24, respectively. For single-ended operation, the single-ended DQS signal is coupled to DQS+ and $V_{REF}$ is coupled to DQS− of Buffer and Control circuitry 24, respectively. The termination circuit portion 40 has a termination circuit 50 having an input connected to the DQS+ signal at a node 57. A termination circuit 52 has an input connected to the DQS− signal at a node 59. Each termination circuit 50 and 52 has a control input bus labeled "Select". The termination circuits 50 and 52 are conventional transmission line termination circuits for eliminating unwanted signal reflections that introduce phase and voltage level errors in a signal. In one form each of these termination circuits may be implemented by a plurality of resistors selectively coupled in parallel between the signal line and a supply voltage terminal to couple a predetermined current and impedance to the signal line. The number of resistors that are electrically coupled between the supply voltage terminal and the signal path is determined by an On-Die Termination select signal labeled "ODT Sel" that is connected to the Select control input of each of termination circuits 50 and 52.

The voltage follower portion 42 has an operational amplifier 54 having a positive or non-inverting input connected to the reference voltage $V_{REF}$ that is provided by the voltage source 34 of FIG. 1. A negative or inverting input of the operational amplifier 54 is connected to an output terminal thereof and to a source of each of an N-channel transistor 56 and an N-channel transistor 58 that form the clamp circuit portion 44. A drain of transistor 56 is connected to node 57, and a drain of transistor 58 is connected to node 59. The gate of transistor 56 is connected to the Clamp Enable 1 signal and the gate of transistor 58 is connected to the Clamp Enable 2 signal provided by the control circuit portion 38.

The differential comparator portion 46 has a differential comparator 64 having a first or a positive input connected to node 57 and a second or negative input connected to node 59. An output of differential comparator 64 provides a DQS output signal labeled "DQS In" and is connected to a first input of an AND gate 80 of control circuit portion 38. The differential comparator portion 46 also has a differential comparator 66 having a first or a positive input and a second or negative input. An output of differential comparator 66 provides a DQS separation signal labeled "DQS Sep In" and is connected to a first input of an AND gate 76 of control circuit portion 38. The signal offset portion 48 has an offset circuit 60 and an offset circuit 62. An input of offset circuit 60 is connected to node 57. An output of offset circuit 60 is connected to the negative input of differential comparator 66. An input of offset circuit 62 is connected to node 59. An output of offset circuit 62 is connected to the positive input of differential comparator 66. Each of the offset circuits 60 and 62 has a control input for receiving a signal labeled "Offset Selection Value (Single/Differential)".

Within the output buffer portion 37 are AND gate 68, AND gate 70 and programmable output amplifier 72. A first input of each of AND gate 68 and AND gate 70 is connected together and to an output enable signal labeled "DQS Out En" which enables the providing of an output DQS signal. A second input of each of AND gate 68 and AND gate 70 are connected together and to a mode signal labeled "Diff Mode". The Diff Mode signal determines whether the DQS OUT signal will be driven in single-ended or differential mode. The second input of AND gate 70 is an active low signal. An output of AND gate 68 is connected to an enable input, labeled END, of programmable output amplifier 72. The output of AND gate 70 is connected to the second enable input, labeled ENS, of programmable output amplifier 72. Programmable output amplifier 72 has an input for receiving a DQS strobe signal, labeled "DQS Out", to be outputted. A first output of programmable output amplifier 72 is connected to node 59 and is an active low output. The first output of programmable output amplifier 72 provides a DQS− Output signal. A second output of programmable output amplifier 72 is connected to node 57 and provides a DQS+ Output signal. Enable inputs END and ENS respectively configure programmable output buffer 72 to operate as a fully differential programmable output amplifier or as a single-ended programmable output amplifier. When configured to operate as a single-ended programmable output amplifier, the single DQS output strobe signal is provided at the DQS+ output of programmable output amplifier 72.

Within the control circuit portion 38, a second input of AND gate 76 receives a Deadtime signal as an active low signal. Thus FIG. 2 illustrates the Deadtime signal with an overstrike. An output of AND gate 76 is connected to a clock input of a flip-flop 78. A data input labeled "D" of flip-flop 78 is connected to a supply voltage terminal for receiving a VDD supply voltage. Flip-flop 78 has an active low Reset terminal labeled "R" with an overstrike. A data output of flip-flop 78 is labeled "Q" and is connected to a second input of AND gate 80. An output of AND gate 80 provides a DQS input signal to memory controller 20 and the signal is labeled "DOS Digital In". The output of AND gate 80 is connected to a clock input of a flip-flop 82. A D data input of flip-flop 82 is connected to a ground reference terminal. A set input of flip-flop 82 receives an enable signal labeled "DOS Input En". An active low reset input of flip-flop 82 receives an active low Reset signal. A Q data output of flip-flop 82 provides a DQS input enable signal labeled "Reg DQS Input En" and is connected to an active low reset input of flip-flop 78 and to a Set (S) input of a flip-flop 84. Flip-flop 84 has an active low Reset input connected to receive the active low Reset signal. A clock input of flip-flop 84 receives the active low Deadtime signal. A data (D) input of flip-flop 84 is connected to receive the DQS Input En enable signal. A data output of flip-flop 84 labeled "Q" provides an ODT (On-Die Termination) enable signal labeled "ODT EN".

Additional circuitry associated with the control portion includes the OR gate 86, AND gates 87, 88, 89, 90, 92 and 94. Different bit values of a multiple-bit On-Die Termination (ODT) value are connected to respective different inputs of OR gate 86 and AND gate 87, 88 and 89. Two respective ODT value bits are connected to first and second inputs of OR gate 86. An output of OR gate 86 is connected to a first input of AND gate 87 and to a first input of an AND gate 90. A second input of AND gate 87 is connected to an On-Die Termination (ODT) enable signal labeled ODT En. A first input of an AND gate 88 is connected to one of the two ODT value bits of the multiple-bit On-Die Termination (ODT) value. A second input of AND gate 88 is connected to the On-Die Termination (ODT) enable signal, ODT En. First and second inputs of an AND gate 89 are respectively connected to the two ODT value bits. A third input of AND gate 89 is connected to the ODT enable signal, ODT En. The ODT value signal may be implemented with various encodings for the represented two bits of the signal. By way of example only, a value of 00 may represent that no impedance is connected to the signal line and no termination is provided except what may be provided external to processing unit 12 and synchronous storage circuitry 14 on interconnect 32. Also in single-ended mode operation, a value of 00 can be placed on the ODT value bits to present no impedance connected to the signal lines denoted by node 57 and node 59. A value of 01 may represent that a seventy-five (75) ohm impedance is connected to the signal line. A value of 10 may represent that a one hundred fifty (150) ohm impedance is connected to the signal line, and a value of 11 may represent that a fifty (50) ohm impedance is connected to the signal line. Other encoding values may be used and more or less than two bits of encoded values may be used. Each of AND gates 87-89 has an output which provides a respective bit of an On-Die Termination (ODT) Select signal, ODT Sel. In the illustrated form, if any of the outputs of AND gate 87-89 is asserted, the On-Die Termination function is turned on or asserted. The ODT Sel signal is connected to the Select input of each of termination circuit 50 and termination circuit 52. An output of AND gate 87 is also connected to a second input of AND gate 90 that is an active low input. An output of AND gate 88 is also connected to a third input of AND gate 90 that is also an active low input. An output of AND gate 89 is also connected to a fourth input of AND gate 90 that is also an active low input. A fifth input of AND gate 90 receives the DQS Output Enable signal (DQS Out En). An output of AND gate 90 provides a Clamp Enable 1 signal that functions to control N-channel transistor 56 of the clamp circuit portion 44 in both single-ended and differential mode operation. The output of AND gate 90 is also connected to a first input of an AND gate 92 and a first input of OR gate 94. The first input of AND gate 92 is an active low input. A second input of AND gate 92 receives the On-Die Termination Enable signal (ODT En). An output of AND gate 92 provides a differential comparator (DA) enable signal, DA Enable, to the enable (En) inputs of each of differential comparator 64 and differential comparator 66. The first input of OR gate 94 is an active low input. A second input of OR gate 94 receives the Diff Mode signal. The output of OR gate 94 provides a Clamp Enable 2 signal that functions to control N-channel transistor 58 of the clamp circuit portion 44 in differential mode operation. In single-ended mode, N-channel transistor 58 of the clamp circuit portion 44 can be left enabled so that DQS− can receive the reference voltage, $V_{REF}$.

Figure 3:
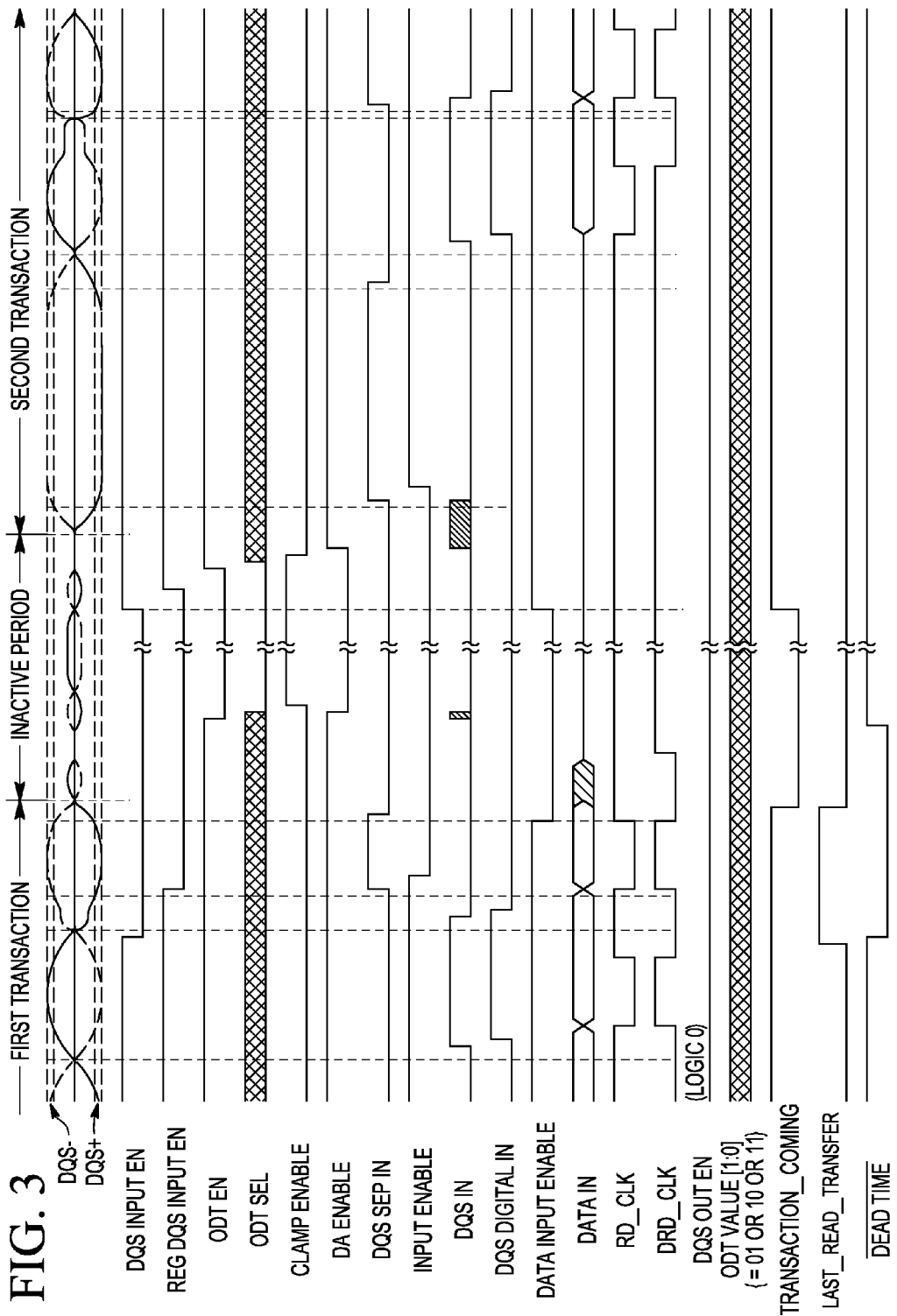
FIG. 3 illustrates in graphical form exemplary control and data signals in accordance with one condition of operation of the processing system of FIG. 1.
Figure 4:
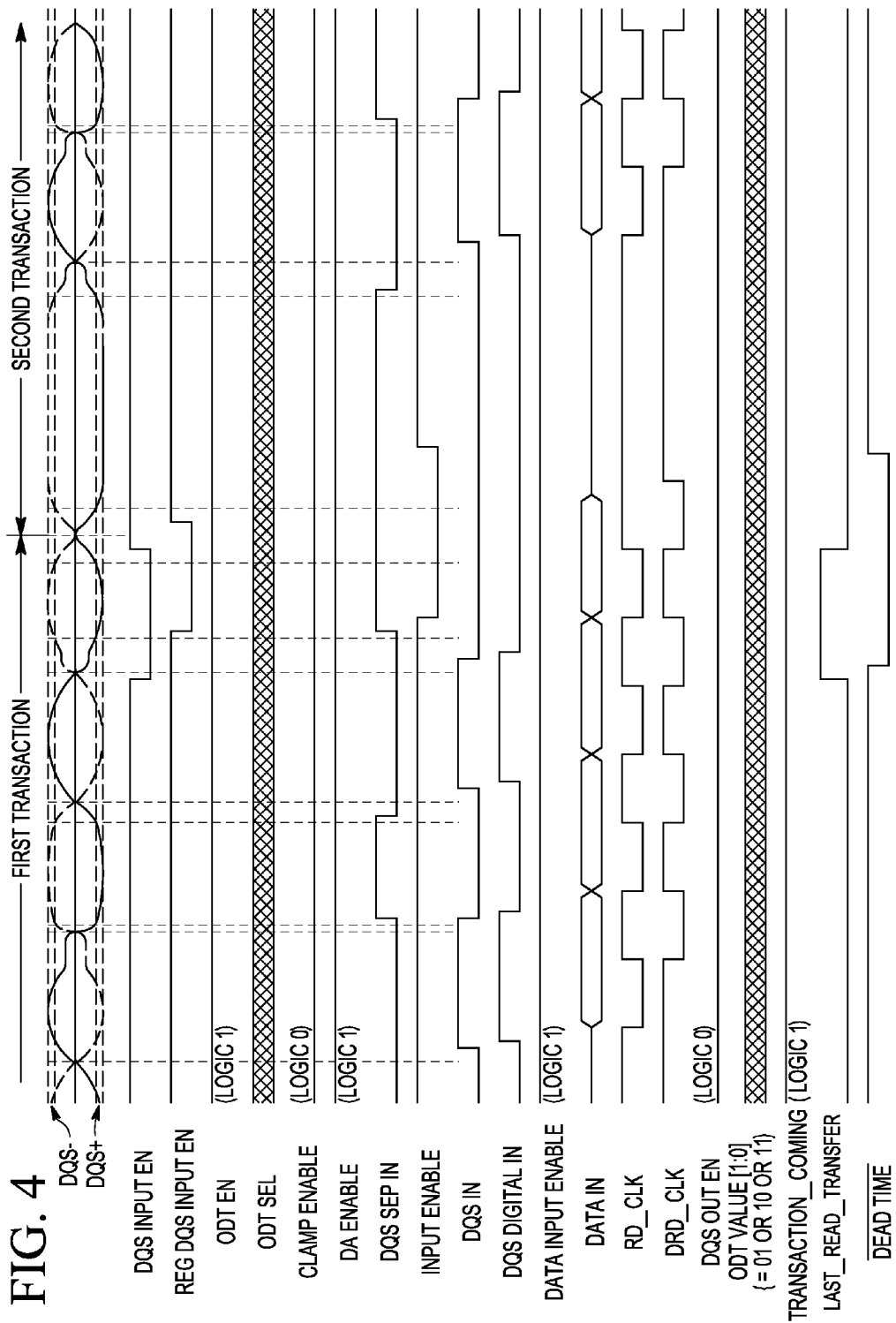
FIG. 4 illustrates in graphical form exemplary control and data signals in accordance with another condition of operation of the processing system of FIG. 1.

A general description of the operation of buffer and control circuitry 24 will be provided and then a discussion of operation with signal values will be provided in connection with examples provided in FIGS. 3 and 4. In general, the description herein will focus on a read operation of information from synchronous storage circuitry 14 to processor 16. In a system where the DQS strobe signal is a single signal, the single-ended DQS signal is coupled to DQS+ and $V_{REF}$ is coupled to DQS−. In differential mode operation, DQS+ and DQS− from Interconnect 32 are respectively connected to node 57 and node 59. Because the operational amplifier 54 is a voltage follower, the output of operational amplifier 54 assumes a voltage proportional to the $V_{REF}$ voltage applied to the non-inverting input of operational amplifier 54. When clamp circuit portion 44 is enabled, each of node 57 and node 59 is respectively clamped to the known $V_{REF}$ value by transistor 56 and transistor 58 depending on the assertion of Clamp Enable 1 and Clamp Enable 2 signals, respectively. The clamping action forces the DQS+ and DQS− signals to a known value in differential mode operation or the DQS signal to a known value in single-ended mode operation. In response to the Clamp Enable 1 and Clamp Enable 2 signals being disabled by becoming a logic low signal, transistor 56 and transistor 58 become nonconductive and each of node 57 and node 59 are allowed to electrically assume the value of DQS+ and DQS− strobe signals, respectively. The DQS+ and DQS− differential signals are presented to differential comparator 64. When the voltage of the difference between DQS+ and DQS− exceeds a predetermined threshold, the DQS In signal has a logic one value. When the voltage of the difference between DQS+ and DQS− does not exceed that threshold, the DQS In signal has a logic zero value. Each of differential comparator 64 and differential comparator 66 receive a control signal respectively labeled "M bits" and "N bits". The function of the M bits and N bits is to program the drive strength or drive current (i.e. the transistor size) of the respective differential comparator. Therefore, the amplitude of the outputs of differential comparators 64 and 66 are programmable. Before the differential comparator 64 and differential comparator 66 can operate, each must be enabled with a logic high DA Enable signal presented to their respective enable input, En, from the control circuit portion 38. The DA Enable signal is asserted when the ODT En signal is asserted and the clamp enable signal is not asserted. Thus On-Die Termination (ODT) must be activated and the clamping action released. However, before the DQS In signal is provided to memory controller 20, the control circuit portion 38 affects the timing of the DQS In signal. A timing adjustment of when the DQS In signal is asserted and de-asserted is performed by differential comparator 66 under control of the control circuit portion 38. The offset circuit 60 functions to add a predetermined positive offset voltage to the DQS+ signal. In contrast, the offset circuit 62 functions to subtract an equal amount of offset voltage from the DQS− signal. Both offset circuit 60 and offset circuit 62 operate under the influence of the Offset Selection Value control signal. When the Offset Selection Value control signal indicates that the DQS signal is a single-ended signal, the offset voltages used by offset circuit 60 and offset circuit 62 are one-half the magnitude as when the Offset Selection Value control signal indicates that the DQS signal is a fully differential signal. By increasing and decreasing the magnitudes of the DQS+ and DQS− signals, respectively, the threshold point when DQS+ diverges from DQS− by a preprogrammed voltage difference is detected by differential comparator 66. Conversely the threshold point when DQS+ converges to DQS− by a preprogrammed voltage difference is also detected by differential comparator 66. At the start of the strobe preamble, the DQS+ signal is driven from Hi-Z to a predetermined low voltage level by the Synchronous Storage Circuitry 14 and concurrently the DQS− signal is driven from Hi-Z to a predetermined high voltage level by the Synchronous Storage Circuitry 14. Thus the output of differential comparator 66 functions as a DQS separation indication signal that detects the start of a preamble. In other words, differential comparator 66 uses the voltage offset provided by offset circuits 60 and 62 to detect when the incoming differential pair signals have separation from each other by a certain programmable voltage difference to determine when it is safe to enable and gate the DQS In signal provided by differential comparator 64 through AND gate 80 only when DQS In is valid after the start of the strobe preamble. Similarly, differential comparator 66 detects when the incoming differential pair of signals, DQS+ and DQS−, have convergence or come together within a certain preprogrammed voltage difference value to determine the end of the strobe signal postamble.

The AND gate 76 and flip-flops 78, 82 and 84 function collectively to selectively provide the Input Enable signal to the second input of AND gate 80. Only upon the assertion of both the DQS In signal and the Input Enable signal will the DQS Digital In signal be provided to the memory controller 20. In order for AND gate 76 to permit the DQS Sep In signal to clock flip-flop 78 to provide the Input Enable signal to AND gate 80, the active low Deadtime signal must be deasserted. The DQS Input Enable signal and flip-flops 82 and 84 collectively function to time the resetting of flip-flop 78. Thus, the buffer and control circuitry 24 is an adaptive circuit that can operate with a variety of types of memory circuits and operating frequencies and is automatic and self-contained in operation (i.e. buffer and control circuitry 24 does not require periodic training or any initialization). Because buffer and control circuitry 24 automatically detects the separation and convergence of the differential signals DQS+ and DQS−, the buffer and control circuitry 24 adapts across all process, voltage and temperature variations and frequencies and is not dependent on variations between differing physical circuit board layouts or multiple Synchronous Storage Circuitry devices all connected to Interconnect 32 at disparate distances from the processing unit (not shown).

The output buffer portion 37 operates separately from the input buffer portion 36 and provides the data strobe signal DQS to time the writing of data from processor 16 to the synchronous storage circuitry 14. The AND gates 68 and 70 receive both a DQS Out Enable signal, DQS Out En, and a Diff mode signal that determines whether to operate in single ended mode or in differential mode. In response to these two control signals, the AND gate 68 and the AND gate 70 respectively configure output buffer portion 37 to operate as a fully differential programmable output amplifier or as a single-ended programmable output amplifier. If the Diff mode signal indicates differential DQS strobe signal operation, then the outputs of output buffer portion 37 are connected directly to nodes 57 and 59 and provided to the interconnect 32. If the Diff mode signal indicates single-ended DQS strobe signal operation, then the DQS+OUT output of output buffer portion 37 is connected directly to node 57, and the DQS-OUT output is disconnected from node 59 and N-channel transistor 58 of clamp circuit portion 44 is enabled so that node 59 is clamped to the known $V_{REF}$ by the operational amplifier 54 which functions as a unity gain buffer.

Illustrated in FIG. 3 is a graphical representation of various control signals and an associated data signal when data is being read from the synchronous storage circuitry 14 and provided to the processor 16 via memory controller 20. In the illustrated form two transactions of data are provided to the processor 16 with an intervening inactive period of time. For purposes of explanation, a discussion will begin with the start of the illustrated second transaction to initially discuss an inactive period and transitioning from the inactive period. At some point a pending request in the memory controller 20 causes the DQS input enable signal to become asserted. That enable signal is captured and registered as the REG DQS input enable signal which in turn causes the ODT enable (ODT En) signal to become asserted which in turn enables the ODT selection signal (ODT Sel) to a termination circuit impedance value. The ODT selection signal assertion causes the clamp enable signals (Clamp Enable 1 and Clamp Enable 2) to negate which in turn causes the circuit portion 44 to be disabled which in turn causes the clamp circuit portion 44 to be disabled. The assertion of ODT enable and negation of Clamp Enable 1 in turn enables the differential comparators 64 and 66 through the response by AND gate 92. Next the differential comparator 66 detects the point at which DQS+ and DQS− separate by a preselected voltage amount. When DQS− is greater than DQS+ by a predetermined separation voltage, then differential comparator 66 asserts the DQS Sep In signal to indicate that a preamble has been detected. This event is registered in flip-flop 78 which asserts the Input Enable signal which enables AND gate 80. Differential comparator 64 is comparing the difference in voltage between DQS+ and DQS− to form the DQS In signal which is passed through AND gate 80 to form the DQS Digital In signal. At the point when DQS Digital In transitions, data begins to be received by the memory controller 20 from the synchronous storage circuitry 14 via storage interface 26, buffer and control circuitry 28, interconnect 32, buffer and control circuitry 24, storage interface 22 and interconnect 21. A Read Clock (Rd_Clk) signal is generated internal to the memory controller 20 and is used internal to the memory controller 20 to receive Read Data from the synchronous storage circuitry 14. The Read Data is typically queued or otherwise stored within the memory controller 20 before being forwarded to an addressed receiving device such as the processor 16 or other module(s) 30. Assume that multiple read transfers occur sequentially in the second transaction until a termination occurs. A termination operation will now be discussed in connection with the end of the first transaction illustrated in FIG. 3.

Assume that the first transaction has started the same way as described in connection with the second transaction. The memory controller 20 is aware of how many read transfers are requested in connection with a transaction. Therefore, when a next-to-last read transfer is reached, a Last Read Transfer signal is asserted internal to the memory controller 20 and remains asserted during a last read transfer as shown in FIG. 3. The memory controller 20 negates the DQS Input enable signal (DQS Input En) when the next-to-last read transfer is reached. When the DQS Input enable signal transitions to a negated state, flip-flop 82 has the Set input disabled so that the flip-flop 82 is sensitive to the output of AND gate 80. When the DQS Digital Input signal transitions low, it causes the Registered DQS Input Enable (REG DQS Input En) to negate which in turn causes the Input Enable signal from flip-flop 78 to negate and disable AND gate 80. AND gate 80 thus prevents the DQS In signal from being passed through and the DQS Digital In signal is negated. The final transfer of the read transaction thus ends and an inactive period begins.

In the inactive period, the DQS input nodes 57 and 59 are allowed initially to electrically float because there are no pending transactions. Upon the expiration of a certain amount of inactive or dead time which started in the last Read transfer, a Deadtime signal will transition to an inactive high and negate the ODT Enable signal via flip-flop 84 which in turn negates the ODT Select signal and the DA Enable signal. The Dead Time signal is generated within the memory controller 20 and the signal generation will be further described in connection with FIG. 5. An inactive DA Enable signal will deactivate the differential comparator 64 output (DQS In). However, AND gate 80 is otherwise already disabled by the Input Enable signal being inactive. The ODT Select signal negation causes the Clamp Enable 1 and Clamp Enable 2 signals to assert thereby clamping the inactive DQS plus and minus signals to the $V_{REF}$ voltage value and will remain this way until another Read transaction is ready to start.

Illustrated in FIG. 4 is a graphical representation of various control signals and an associated data signal when data is being read from the synchronous storage circuitry 14 and provided to the processor 16 via memory controller 20. In the illustrated form two transactions of data are provided to the processor 16 with no intervening inactive period of time.

Assume again that the first transaction has started the same way as described in connection with the second transaction of FIG. 3. The memory controller 20 is aware of how many read transfers are requested in connection with a read transaction. Therefore, when a next-to-last read transfer is reached, a Last Read Transfer signal is asserted internal to the memory controller 20 and remains asserted during a last read transfer as shown in FIG. 4. The memory controller 20 negates the DQS Input enable signal (DQS Input En) when the next-to-last read transfer is reached. When the DQS Input enable signal transitions to a negated state, flip-flop 82 has its Set input disabled so that the flip-flop 82 is sensitive to the output of AND gate 80. When the DQS Digital Input signal transitions low, it causes the Registered DQS Input Enable (Reg DQS Input En) to negate which in turn causes the Input Enable signal from flip-flop 78 to negate and disable AND gate 80. AND gate 80 thus prevents the DQS In signal from being passed through and the DQS Digital In signal is negated to memory controller 20 to thereby end the last read transfer of the first transaction. In this example, prior to the end of the first transaction, memory controller 20 determines that the second transaction should start. The memory controller 20 asserts the DQS Input Enable signal coupled to the set input of flip-flop 82. The assertion of the DQS Input Enable signal is registered in flip-flop 82 and causes the assertion of the Registered DQS input enable signal (Reg DQS Input En). Flip-flop 84 does not change its state in response to the Registered DQS input enable signal being asserted because flip-flop 84 was previously set. Flip-flops 78, 82 and 84 collectively function to properly time the transitioning of the signals Input Enable, On-Die Termination (ODT) En, Clamp Enable, DA Enable and ODT Select primarily.

A second transaction begins immediately after the first transaction without an intervening inactive period. This is a problematic situation for the detection of the postamble end and preamble start because the DQS+ and DQS− signals may not reach valid voltage levels to determine when one ends and the other starts. Thus the need for a Deadtime signal exists to prevent a false detection and, conversely, non-detection of a preamble. The Deadtime signal functions when in an active low level to prevent the false detection or non-detection of a preamble as a result of indeterminate values existing for DQS+ and DQS−. Between the first transaction and the second transaction the values of DQS+ and DQS− are indeterminate. The indeterminate values can occur at the transition between the first transaction and the second transaction as a result of the device drivers of buffer and control circuitry 28 being disabled prior to the end of the first transaction and during the end of a last data transfer in the postamble. When the device drivers are turned off prior to the end of the first transaction (i.e. the postamble), the strobe signals may assume voltage values which float and thus have indeterminate logic values. Thus a zero crossing of the DQS+ and DQS− signals may never occur which may have the effect of not being able to properly detect the end of the postamble of the first transaction and the beginning of the preamble of the second transaction. The Deadtime signal is asserted long enough to pass over the indeterminate period of time between a postamble and preamble. When the Deadtime signal becomes inactive, AND gate 76 is enabled to once again pass through the DQS Sep In signal which asserts when differential comparator 66 detects the preamble causing flip-flop 78 to assert the input enable signal thereby enabling AND gate 80 to pass through DQS In.

Figure 5:
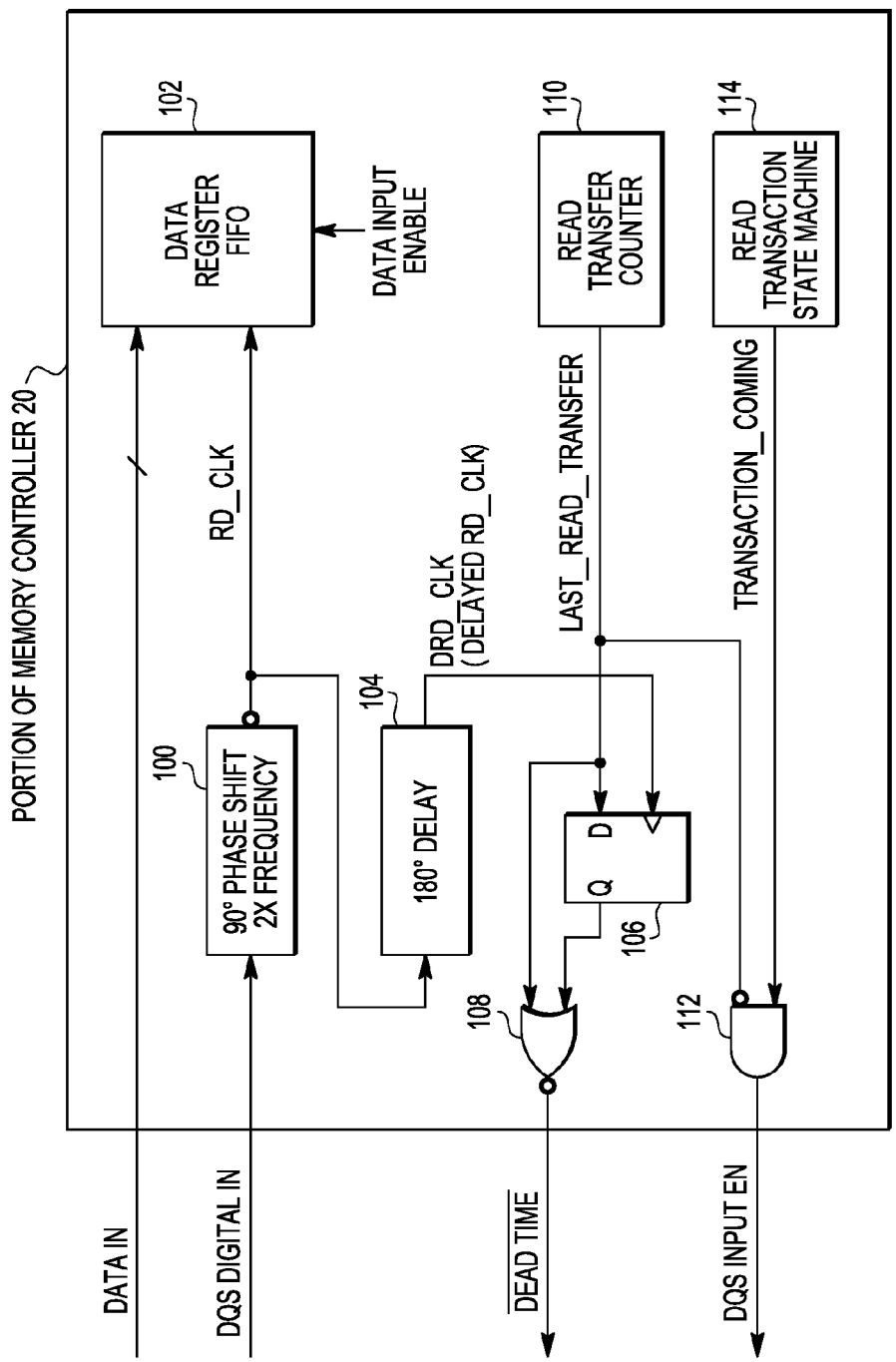
FIG. 5 illustrates in block diagram form a portion of a memory controller for use in the processing system of FIG. 1.

Illustrated in FIG. 5 is further detail of a portion of memory controller 20 that details how the active low Deadtime signal is provided. The output of AND gate 80 provides the DQS Digital In signal to memory controller 20. The DQS Digital In signal is connected to an input of an inverting Ninety Degree Phase Shift and 2× Frequency Multiplier circuit 100. An output of the inverting Ninety Degree Phase Shift and 2× Frequency Multiplier circuit 100 is a read clock signal, Rd_clk, and is connected to both a clock input of a data register FIFO (first-in, first-out) register 102 and to an input of a One Hundred and Eighty Degree Delay circuit 104. An output of the One Hundred and Eighty Degree Delay circuit 104 is connected to a clock input of a flip-flop 106. A Q data output of flip-flop 106 is connected to a first input of a NOR gate 108. A read transfer counter 110 provides a count value output that is the Last Read Transfer signal and is connected a data (D) input of flip-flop 106, to a second input of NOR gate 108 and to an active low first input of an AND gate 112. An output of the NOR gate 108 provides the Deadtime signal in active low form as represented by the overlying bar that is used by the control circuit portion 38 of FIG. 2. A Read Transaction State Machine 114 has an output for providing the Transaction Coming (Transaction_Coming) signal that is connected to a second input of AND gate 112. An output of AND gate 112 provides the DQS Input Enable signal, DQS Input En, that is used by control circuit portion 38 of FIG. 2.

In operation, the DQS digital input signal (DQS digital in) is processed by the inverting ninety degree phase shift and 2× frequency multiplier circuit 100. In addition to the phase being shifted by ninety degrees, the DQS digital input signal has its frequency doubled and inverted. An adaptive phase shifting, frequency doubling, and inverting circuit may be used in one form. The output of the inverting ninety degree phase shift and 2× frequency multiplier circuit 100 produces a read clock (Rd_Clk) with rising edges centered in time between transitions of the DQS digital input signal which is used to clock data in the data FIFO register 102 that has been read from the synchronous storage circuitry 14. The Rd_clk signal is coupled to the One Hundred and Eighty Degree Delay circuit 104 which is implemented by an adaptive delay circuit to produce the Delayed Read Clock (DRd_clk) signal. The output of the one hundred and eighty degree delay circuit 104 is a one hundred and eighty degree delayed version of the read clock (DRd_clk) provided by the inverting ninety degree phase shift and 2× frequency multiplier circuit 100 and is connected to the clock input of the flip-flop 106. The read transfer counter 110 provides a count value of read transfers and when a next-to-last read transfer is reached, the Last Read Transfer signal is asserted and remains asserted during the last read transfer. The asserted value will cause the Deadtime signal to transition to a low logic value during the last read transfer of a transaction. Thus the Deadtime signal specifies a window in time wherein during the window a postable begins and ends and a subsequent preamble begins. The Last Read Transfer signal is captured by the delayed read clock and is provided at the Q output of flip-flop 106. The Deadtime signal will transition back to a logic high value after the last read transfer has occurred indicated by the read counter 110 negation of the last read transfer signal and subsequent capture of the negated last read transfer signal by the last one hundred and eighty degree delayed rising edge delayed read clock in flip-flop 106. The logical NOR of the negated last read transfer signal at the first input of NOR gate 108 together with the delayed version of the negated last read transfer signal at the second input of NOR gate 108 cause the Deadtime signal to negate. When memory controller 20 needs to prepare for a new read transaction from synchronous storage circuitry 14, the read transaction state machine 114 provides a logic high value for the Transaction_Coming signal and the Last_Read Transfer count value has a logic low value, AND gate 112 asserts the DQS Input enable signal, DQS Input En. Thus the memory controller 20 functions to provide only preparatory information about upcoming beginning and ending read transactions with the active low Deadtime signal and active high DQS Digital En signal but in return receives a valid, qualified, and temporally exact DQS Digital En formulated from the storage interface 22 circuitry DQS+ and DQS− signals.

By now it should be appreciated that there has been provided a self-enabling and a self-disabling DQS input/output buffer and method of operation for controlling the timing of receiving data communicated with a synchronous storage circuit such as a DDR SDRAM. Preamble and postamble phases are detected whenever these phases occur by differentially comparing a separation voltage difference between DQS and a reference voltage or between DQS+ and DQS−. Voltage floating conditions on the transmission interconnect are prevented from occurring by the selective use of timed voltage clamping. The voltage clamping prevents false positive detections of a DQS preamble when no termination circuitry is on the DQS+ and DQS− signal lines. Without the use of a voltage clamp, the DQS signal line during quiescent times will electrically float and may trip differential comparators which results in false assertions of the DQS In signal. The false assertions may take the form of an oscillating DQS In signal, generate intermediate voltage values that cannot be interpreted as a logic one or logic zero by digital logic that is used to capture data, or may cause pulses and glitches that lead to unknown circuit states in subsequent logic. The self-enabling and self-disabling nature of the disclosed embodiments of the DQS input buffer permit very high speed interfaces, particularly well adapted for operation in the GHz range. With the self-enabling and self-disabling nature is the ability to automatically adapt across frequency ranges from very low to very high frequencies and accommodate discontinuous frequency changes without adjustment of internal or external parameters or settings as well as round trip or timing variability due to process, voltage, temperature, frequency, transmission line effects, physical system layout, differing time delays between temporally separated multiple system memories such as SDRAM or SDRAM DIMMs (Dual In-Line Memory Modules), variability as to when synchronous storage circuitry will return DQS (as may be the case with LPDDR2 (Low Power DDR2) SDRAM), variability between synchronous storage circuitry vendor devices, and power reduction. The reliable operation provided herein is transparent to a user of the circuit. A memory controller or sequence controller in an SDRAM does not need to intervene or oversee the strobe signal timing operation. Software is not required to implement any training routines and no extra integrated circuit pins are necessary. Additionally, a user is not required to set or meet critical timing parameters in a system-level design using the disclosed buffer.

There is herein provided in one form a method wherein at least one conductor for receiving an input signal is provided. A termination circuit (50, 52) is coupled to the at least one conductor. A clamp circuit (44) is coupled to the at least one conductor. The termination circuit (50, 52) is enabled while the clamp circuit (44) remains enabled. The clamp circuit (44) is then disabled. After the clamp circuit (44) is disabled and while the termination circuit (50, 52) remains enabled, both a first differential comparator (64) and a second differential comparator (66) are enabled. The first differential comparator (64) receives a first differential input signal (DQS+) at a first input and a second differential input signal (DQS−) at a second input. The second differential comparator (66) detects when a difference between the first differential input signal (DQS+) and the second differential input signal (DQS−) becomes greater than a predetermined value. When the difference between the first differential input signal (DQS+) and the second differential input signal (DQS−) is greater than the predetermined value, transfer of an output (DQS_In) of the first differential comparator (64) to a memory controller (20) is enabled via AND gate 80 as a qualified DQS digital input (DQS Digital In). In another form a first offset value (offset_1) is added to the first differential input signal (DQS+) to produce a first offset differential input signal (offset_1+DQS+). The second differential comparator (66) receives the first offset differential input signal (offset_1+DQS+) at a first input. In another form a second offset value (offset_2) is subtracted from the second differential input signal (DQS−) to produce a second offset differential input signal (−offset_2+DQS−), wherein the second differential comparator (66) receives the second offset differential input signal (−offset_2+DQS−) at a second input. In another form the first offset value and the second offset value have a same value. In yet another form the first offset value and the second offset value are programmable. In another form the predetermined value is a sum of the first offset value and the second offset value. In yet another form a single-ended input signal (DQS) is provided at the first input of the first differential comparator (64) instead of the first differential input signal (DQS+), wherein a reference voltage signal ($V_{REF}$) is provided at the second input of the first differential comparator (64) instead of the second differential input signal (DQS−), and wherein the predetermined value is reduced by twenty-five percent or more. In yet another form, a drive strength of at least one of the first differential comparator (64) and the second differential comparator (68) is selected.

In another form there is herein provided a circuit having at least one conductor for receiving an input signal. A termination circuit (50, 52) is coupled to the at least one conductor. A clamp circuit (44) is coupled to the termination circuit and the at least one conductor. A first differential comparator (64) has a first input and a second input, the first differential comparator (64) is coupled to the clamp circuit (44). A memory controller (20) is coupled to the first differential comparator (64). A second differential comparator (66) has a first input and a second input, the second differential comparator (66) being coupled to the clamp circuit (44), wherein the first differential comparator (64) receives a first input signal (DQS+ or DQS) at the first input and a second input signal (DQS− or $V_{REF}$) at the second input. The second differential comparator (66) detects when a difference between the first input signal (DQS+ or DQS) and the second input signal (DQS− or $V_{REF}$) is greater than a predetermined value. When a difference between the first input signal (DQS+ or DQS)

and the second input signal (DQS− or $V_{REF}$) is greater than the predetermined value, transfer of an output signal (DQS_In) from the first differential comparator (64) to the memory controller (20) is enabled. In another form the first input signal is a positive differential signal (DQS+) and the second input signal is a negative differential signal (DQS−). In another form the first input signal is a single-ended signal (DQS) and the second input signal is a voltage reference signal ($V_{REF}$). In another form there is provided a first offset circuit (60) coupled to the first input of the second differential comparator (66). A second offset circuit (62) is coupled to the second input of the second differential comparator (66). In another form the first offset circuit (60) has an input for receiving an offset selection value to determine a first offset value, and wherein the second offset circuit (62) has an input for receiving the offset selection value to determine a second offset value. In another form there is provided voltage follower circuitry (42) coupled to the clamp circuit (44). In another form there is provided control circuitry (38) coupled to an output of the first differential comparator (64) and coupled to an output of the second differential comparator (66). In yet another form an input terminal to the control circuitry (38) receives a Deadtime signal, the Deadtime signal specifying a window, wherein during the window a postamble begins and ends and a subsequent preamble begins. In another form during at least a portion of the window, the first input signal (DQS+ or DQS) and the second input signal (DQS− or $V_{REF}$) are not guaranteed to be determinate (i.e. certain as to value). In another form an enable signal (DQS_Input_En) is provided as an input to the control circuitry (38), the enable signal enabling the circuit to perform detection of a read preamble.

In yet another form there is provided a method wherein at least one conductor is provided for receiving an input signal. A termination circuit is coupled to the at least one conductor. A clamp circuit is coupled to the at least one conductor. The termination circuit portion (40) is enabled while the clamp circuit (44) remains enabled. The clamp circuit (44) is disabled. After disabling the clamp circuit (44), while the termination circuit (50, 52) remains enabled, both a first differential comparator (64) and a second differential comparator (66) are enabled. The first differential comparator (64) receives a first differential input signal (DQS+) at a first input and a second differential input signal (DQS−) at a second input. When a difference between the first differential input signal (DQS+) and the second differential input signal (DQS−) is greater than a predetermined value, this difference is detected by using the second differential comparator (66). When the difference between the first differential input signal (DQS+) and the second differential input signal (DQS−) is greater than the predetermined value, transfer of an output (DQS_In) of the first differential comparator (64) to a memory controller (20) is enabled. The termination circuit (50, 52) is disabled. Both the first differential comparator (64) and the second differential comparator (66) are disabled. The clamp circuit (44) is enabled. In another form a drive strength of the output (DQS_In) of the first differential comparator (64) is selected.

Although the invention has been described with respect to specific conductivity types or polarity of potentials, skilled artisans appreciate that conductivity types and polarities of potentials may be reversed. In an alternative any of the embodiments described herein may be implemented by reversing the conductivities of each of the transistors from what is shown. In such embodiments it should be understood that functionality of specific transistors also reverses. For example, different logic gate combinations may be implemented to accomplish the disclosed functionality. Various types of termination circuits may be used. Encodings used for the control signals may be varied while still obtaining the desired functionality.

The term "coupled," as used herein, is not intended to be limited to a direct coupling or a mechanical coupling. Although the invention is described herein with reference to specific embodiments, various modifications and changes can be made without departing from the scope of the present invention as set forth in the claims below. For example, various types of transistors may be implemented, such as MOS (metal oxide semiconductor), bipolar, GaAs, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:

providing at least one conductor for receiving an input signal;

coupling a termination circuit to the at least one conductor;

coupling a clamp circuit to the at least one conductor;

enabling the termination circuit while the clamp circuit remains enabled;

disabling the clamp circuit;

after disabling the clamp circuit, while the termination circuit remains enabled, enabling both a first differential comparator and a second differential comparator, wherein the first differential comparator receives a first differential input signal at a first input and a second differential input signal at a second input;

detecting, by way of the second differential comparator, when a difference between the first differential input signal and the second differential input signal is greater than a predetermined value; and when the difference between the first differential input signal and the second differential input signal is greater than the predetermined value, enabling transfer of an output of the first differential comparator to a memory controller.

2. A method as in claim 1, further comprising:

adding a first offset value to the first differential input signal to produce a first offset differential input signal, wherein the second differential comparator receives the first offset differential input signal at a first input.

3. A method as in claim 2, further comprising:
subtracting a second offset value from the second differential input signal to produce a second offset differential input signal,
wherein the second differential comparator receives the second offset differential input signal at a second input.

4. A method as in claim 3, wherein the first offset value and the second offset value have a same value.

5. A method as in claim 3, wherein the first offset value and the second offset value are programmable.

6. A method as in claim 3, wherein the predetermined value is a sum of the first offset value and the second offset value.

7. A method as in claim 1, wherein a single-ended input signal is provided at the first input of the first differential comparator instead of the first differential input signal, wherein a reference voltage signal is provided at the second input of the first differential comparator instead of the second differential input signal, and wherein the predetermined value is reduced by twenty-five percent or more.

8. A method as in claim 1, further comprising:
selecting a drive strength of the output of the first differential comparator.

9. A circuit, comprising:
at least one conductor for receiving an input signal;
a termination circuit coupled to the at least one conductor;
a clamp circuit coupled to the termination circuit and the at least one conductor;
a first differential comparator having a first input and a second input, the first differential comparator being coupled to the clamp circuit;
a memory controller coupled to the first differential comparator; and
a second differential comparator having a first input and a second input, the second differential comparator being coupled to the clamp circuit,
wherein the first differential comparator receives a first input signal at the first input and a second input signal at the second input,
wherein the second differential comparator detects when a difference between the first input signal and the second input signal is greater than a predetermined value, and
wherein when a difference between the first input signal and the second input signal is greater than the predetermined value, transfer of an output signal from the first differential comparator to the memory controller is enabled.

10. A circuit as in claim 9, wherein the first input signal is a positive differential signal and the second input signal is a negative differential signal.

11. A circuit as in claim 9, wherein the first input signal is a single-ended signal and the second input signal is a voltage reference signal.

12. A circuit as in claim 9, further comprising:
a first offset circuit coupled to the first input of the second differential comparator; and
a second offset circuit coupled to the second input of the second differential comparator.

13. A circuit as in claim 12, wherein the first offset circuit comprises an input for receiving an offset selection value to determine a first offset value, and wherein the second offset circuit comprises an input for receiving the offset selection value to determine a second offset value.

14. A circuit as in claim 9, further comprising:
voltage follower circuitry coupled to the clamp circuit.

15. A circuit as in claim 9, further comprising:
control circuitry coupled to an output of the first differential comparator and coupled to an output of the second differential comparator.

16. A circuit as in claim 15, further comprising:
an input terminal to the control circuitry for receiving a deadtime signal, the deadtime signal specifying a window, wherein during the window a postamble begins and ends and a subsequent preamble begins.

17. A circuit as in claim 16, wherein during at least a portion of the window, the first input signal and the second input signal are not guaranteed to be determinate.

18. A circuit as in claim 15, further comprising:
an enable signal provided as an input to the control circuitry, the enable signal enabling the circuit to perform detection of a read preamble.

19. A method, comprising:
providing at least one conductor for receiving an input signal;
coupling a termination circuit to the at least one conductor;
coupling a clamp circuit to the at least one conductor;
enabling the termination circuit while the clamp circuit remains enabled;
disabling the clamp circuit;
after disabling the clamp circuit, while the termination circuit remains enabled, enabling both a first differential comparator and a second differential comparator,
wherein the first differential comparator receives a first differential input signal at a first input and a second differential input signal at a second input;
detecting, by way of the second differential comparator, when a difference between the first differential input signal and the second differential input signal is greater than a predetermined value;
when the difference between the first differential input signal and the second differential input signal is greater than the predetermined value, enabling transfer of an output of the first differential comparator to a memory controller;
disabling the termination circuit;
disabling both the first differential comparator and the second differential comparator; and
enabling the clamp circuit.

20. A method as in claim 19, further comprising:
selecting a drive strength of at least one of the first differential comparator and the second differential comparator.

* * * * *